(12) United States Patent
Huang et al.

(10) Patent No.: US 6,977,869 B2
(45) Date of Patent: Dec. 20, 2005

(54) NON-VOLATILE MEMORY AND METHOD OF OPERATION

(75) Inventors: Shui-Chin Huang, Tai-Nan (TW); Chien-Hung Chen, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 241 days.

(21) Appl. No.: 10/707,108

(22) Filed: Nov. 21, 2003

(65) Prior Publication Data

US 2005/0111262 A1 May 26, 2005

(51) Int. Cl.[7] .............................................. G04B 18/00
(52) U.S. Cl. ............................ 368/185.28; 365/185.29; 365/185.33
(58) Field of Search ....................... 365/185.28, 185.29, 365/185.33, 185.01, 185.1

(56) References Cited

U.S. PATENT DOCUMENTS

| | | | | |
|---|---|---|---|---|
| 4,794,562 A | * | 12/1988 | Kato et al. ................ | 365/185.1 |
| 6,266,278 B1 | * | 7/2001 | Harari et al. ........... | 365/185.18 |
| 6,344,993 B1 | * | 2/2002 | Harari et al. ........... | 365/185.01 |
| 6,455,887 B1 | * | 9/2002 | Lin et al. .................... | 257/314 |

* cited by examiner

Primary Examiner—Gene N. Auduong
(74) Attorney, Agent, or Firm—Winston Hsu

(57) ABSTRACT

A method of programming and erasing an electrically erasable programmable read-only memory (EEPROM)device includes performing a band-to-band tunneling induced hot-electrons program and performing a Fowler-Nordheim tunneling erase. The EEPEOM device includes a P-type transistor, an N-type transistor, and a double gate P-type transistor. A source of the P-type transistor and the N-type transistor are respectively electrically connected to a program bit-line and an erase bit-line. A drain of the double gate P-type transistor is electrically connected to a drain of the P-type transistor and a drain of the N-type transistor.

19 Claims, 6 Drawing Sheets

| Operation | Pbl | Ebl | CG | SG | SL | DNW | PW |
|---|---|---|---|---|---|---|---|
| Program | -6V | F/G | +8V | -8V | F | G | G |
| Erase | F/G | +8V | -8V | +10V | F | G | G |
| Read | +1V | F/G | G | G | +3.3V | +3.3V | G |

Fig. 6

NON-VOLATILE MEMORY AND METHOD OF OPERATION

BACKGROUND OF INVENTION

1. Field of the Invention

The present invention provides a non-volatile memory and a method of programming and erasing, and more particularly, the present invention relates to an electrically erasable programmable read-only memory (EEPROM) and a method of programming and erasing.

2. Description of the Prior Art

An EEPROM device is a kind of non-volatile memory. The structure of EEPROMs is similar to that of erasable programmable read-only memories (EPROMS) since both of them have a floating gate for storing charges and a control gate for controlling data access. In a large number of memory cells, each memory cell comprises a floating gate for storing charges which represent data. After the floating gate of the memory cell is charged, the threshold voltage of the memory cell is lifted, so the charged memory cell will not be in a conductive state during addressing in reading. A state of not conducting is regarded as a "0" state or a "1" state by detecting circuits utilizing a binary system. Uncharged memory cells will be regarded as being in a "1" state or in a "0" state correspondingly. In comparison with an EPROM which is programmed and erased as a whole, EEPROM has the advantage of erasing and programming data bit by bit. Therefore, the EEPROM is a byte addressable device.

Since the flash memory is erased block by block rather than bit by bit, EEPROM is superior to the flash memory in partial data revision when compared with the flash memory product, which is rapidly growing in market. The EEPROM is very suitable to be used in an embedded function, such as an address book in cell phones, because of its byte program/erase feature. In addition, EEPROM products usually have good high reliability performance, which increases applicability in application fields requiring repetitive programming, reading, and erasing.

Please refer to FIG. 1, FIG. 1 is a cross-sectional schematic diagram illustrating a prior art EEPROM device 10. As shown in FIG. 1, the prior art EEPROM device 10 is disposed on a semiconductor wafer 11. The semiconductor wafer 11 comprises a P-type silicon substrate 12. The EEPROM device 10 comprises a memory cell 14. The memory cell 14 comprises a source region 16 and a drain region 18 disposed on a surface of the P-type silicon substrate 12, and a channel region 22 between the source region 16 and the drain region 18. Both the source region 16 and the drain region 18 are N-type heavy doped regions. The memory cell 14 further comprises a tunnel oxide layer 24, a floating gate 26, a dielectric layer 28, and a control gate 32. The tunnel oxide layer 24 is disposed on a top surface 25 of the P-type silicon substrate 12, and the tunnel oxide layer 24 covers the channel region 22. The floating gate 26 is disposed on a surface of the tunnel oxide layer 24. The dielectric layer 28 covers the floating gate 26. The control gate 32 is disposed on a surface of the dielectric layer 28 and the surface of the tunnel oxide layer 24.

The EEPROM device 10 further comprises an N-type select gate transistor 34. The select gate transistor 34 comprises a source region 36, a drain region, and a gate 38. Since the drain region of the N-type select gate transistor 34 is overlapped with the source region 16 of the memory cell 14, it is not specially marked. In addition, the source region 36 of the N-type select gate transistor 34 is electrically connected to a bit line (BL).

When the memory cell 14 is selected to perform a program operation, a high positive potential (such as +12 V) is supplied to the control gate 32. At this time, the N-type select gate transistor 34 is turned on to pass a program potential (such as 2.5 V) supplied to the bit line to the source region 16 of the memory cell 14. In addition, a terminal 42 electrically connected to the P-type silicon substrate 12 is grounded. Since the program potential and the potential of the P-type silicon substrate 12 are obviously lower than the positive potential supplied to the control gate 32, high potential differences exist to produce an electric field that transverses the tunnel oxide layer 24. Therefore, electrons flowing from the source region 16 to the drain region 18 will acquire kinetic energy due to the existence of the electric field, and change their acceleration direction and transverse the tunnel oxide layer 24 by Fowler-Nordheim (FN) tunneling mechanism. The electrons then are injected into the floating gate 26 and are trapped in the floating gate 26 to complete the program operation. The threshold voltage of the N-type memory cell 14 is thus lifted.

When the memory cell 14 is selected to perform an erase operation, a high negative potential (such as −12 V) is supplied to the control gate 32. At this time, the N-type select gate transistor 34 is turned on to pass an erase potential (such as +2.5 V) supplied to the bit line to the source region 16 of the memory cell 14. In addition, the terminal 42 electrically connected to the P-type silicon substrate 12 is grounded. Since the erase potential and the potential of the P-type silicon substrate 12 are obviously higher than the potential supplied to the control gate 32, not only is the channel region 22 of the memory cell 14 not conducted, but also high potential differences exist to produce an electric field that transverses the tunnel oxide layer 24 (opposite to the direction of the electric field when programming). Therefore, electrons stored in the floating gate 26 will be driven to move toward the channel region 22, and are sucked out to the channel region 22 from the floating gate 26 by Fowler-Nordheim tunneling mechanism. The erase operation is thus completed.

In the prior art, both the program operation and the erase operation which charge or discharge the floating gate utilizes Fowler-Nordheim tunneling mechanism. This method has its native limitation in that the Fowler-Nordheim tunneling behavior of electrons does not happen under the electric field produced by a low potential difference. That means, in order to make this behavior happen, a high potential difference must exist to result in a very slow program speed and erase speed. Furthermore, electrons enter and leave the floating gate 26 through a tunnel window 44, as shown in FIG. 1, in the prior art. Because the tunnel oxide layer 24 inside the tunnel window 44 is very thin, the tunneling behavior of electrons is benefited to improve the performance of the memory device. However, a process problem is encountered.

In the prior art memory cell 14, a buried implant region 46 is respectively formed in portions of the channel region 22 near the source region 16 and the drain region 18, as shown in FIG. 1, before forming the tunnel window 44. The buried implant region 46 is an N-type lightly doped region. The objective of forming the buried implant regions 46 is to lift tunneling efficiency so as to improve program speed and hot electrons injection. Since the tunnel window 44 is within the range of the buried implant region 46, it thus becomes very difficult when aligning the tunnel window 44. In consideration of this problem, the size of the tunnel window 44 cannot be shrunk to avoid the misalignment problem, leading to a barrier to memory cell 14 shrinkage. In some of the prior arts, the methods for forming tiny tunnel windows are taught. However, process steps are complex in these methods to increase processing complexity and cost of products.

Therefore, it is very important to develop a new EEPROM structure. This EEPROM structure should perform program and erase under low operation voltages to improve operation speed. In addition, the need of the tunnel window is eliminated in this EEPROM structure such that the memory cell is shrunk without increasing processing complexity and product costs.

SUMMARY OF INVENTION

It is therefore a primary objective of the present invention to provide an EEPROM structure and a method of programming and erasing to resolve the above-mentioned problems.

The present invention provides a method of programming and erasing an EEPROM device. The method comprises performing a band-to-band tunneling induced hot-electrons program via a program bit-line and performing a Fowler-Nordheim tunneling erase via an erase bit-line. The EEPEOM device comprises a P-type transisitor, an N-type transistor, and a double gate P-type transistor. A source of the P-type transistor is electrically connected to the program bit-line. A source of the N-type transistor is electrically connected to the erase bit-line. A drain of the double gate P-type transistor is electrically connected to a drain of the P-type transistor and a drain of the N-type transistor.

It is an advantage of the present invention that the present invention EEPROM device utilizes the P-type EEPROM cell to replace the N-type EEPROM cell. Furthermore, a P-type select gate transistor electrically connected to the program bit-line is utilized to perform the band-to-band tunneling induced hot-electrons program, and an N-type select gate transistor electrically connected to the erase bit-line is utilized to perform the Fowler-Nordheim tunneling erase. Owing to the considerable current generated by the band-to-band tunneling induced hot-electrons phenomenon, the injection of hot electrons caused by band-to-band tunneling mechanism is faster than that caused by Fowler-Nordheim tunneling mechanism. Therefore, program speed is greatly improved. Because of the obviously lifted program efficiency, the tunnel window, adapted in the prior art EEPROM device structure, can be replaced by a common tunnel oxide layer in the present invention EEPROM device structure. As a result, the problems of complex processing and raised cost incurred from misalignment, which usually occurs in the prior art, are avoided. The barrier to device shrinkage is not encountered. In addition, operation voltage is obviously lowered to expand the range of application under the industry stream of lightweight and small size.

These and other objectives of the present invention will no doubt become obvious to those of ordinary skill in the art after having read the following detailed description of the preferred embodiment that is illustrated in the various figures and drawings.

BRIEF DESCRIPTION OF DRAWINGS

FIG. 6 is an example table illustrating operation voltages of the present invention EEPROM device.

DETAILED DESCRIPTION

Figure 1:
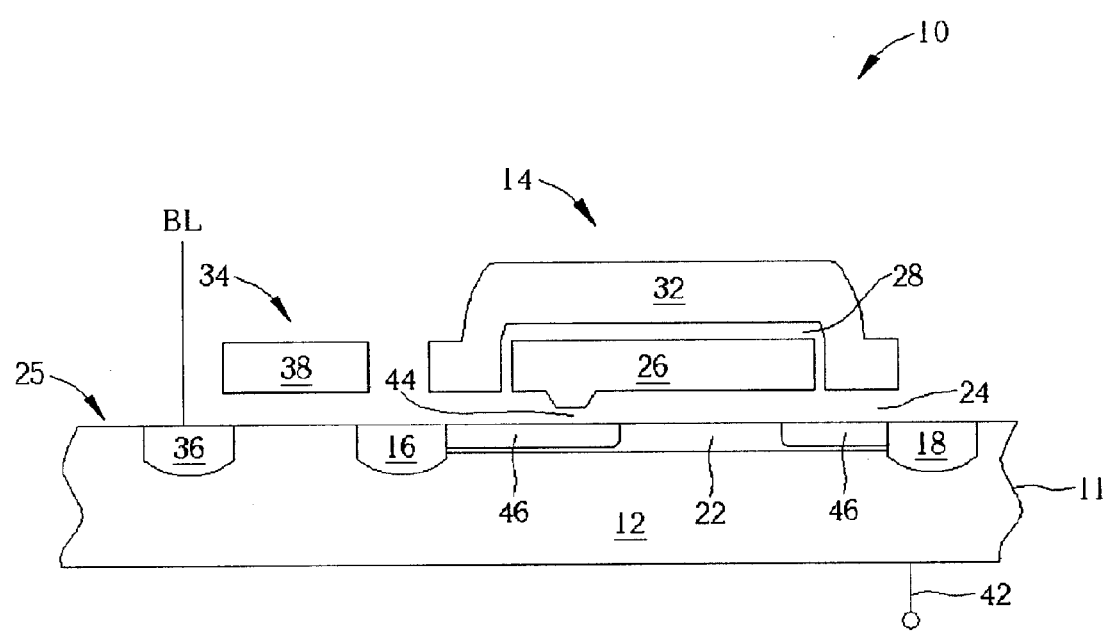
FIG. 1 is a cross-sectional schematic diagram illustrating a prior art EEPROM device.
Figure 2:
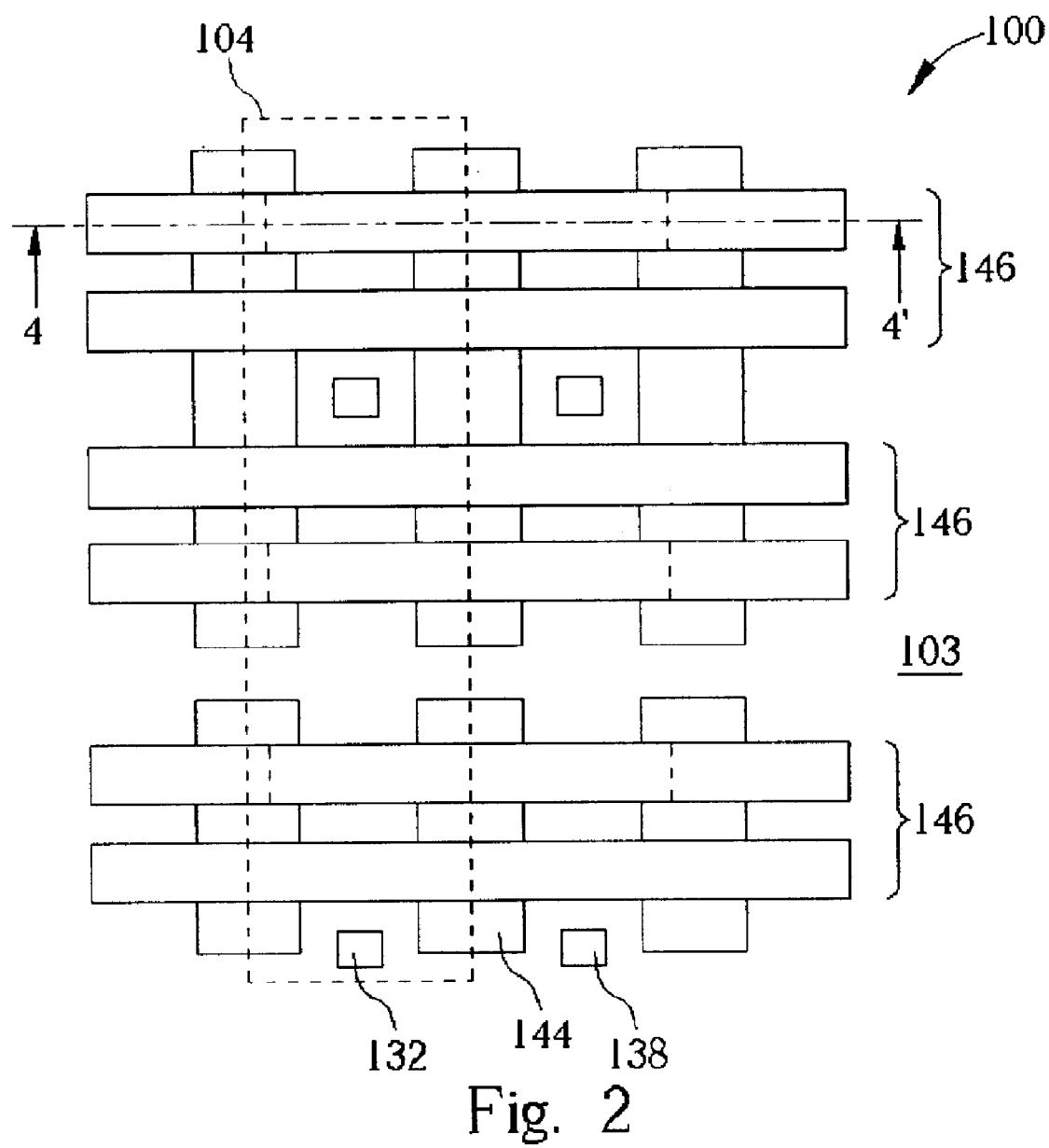
FIG. 2 is a layout diagram of the present invention EEPROM device.
Figure 3:
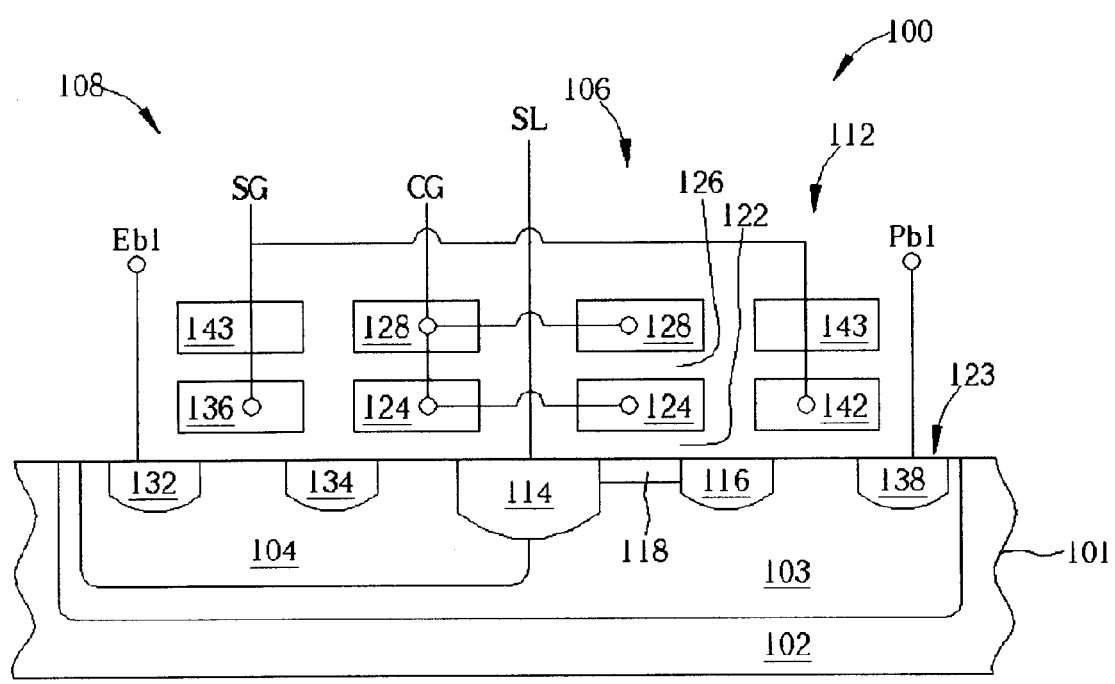
FIG. 3 is a cross-sectional schematic diagram of the EEPROM device shown in FIG. 2.
Figure 4:
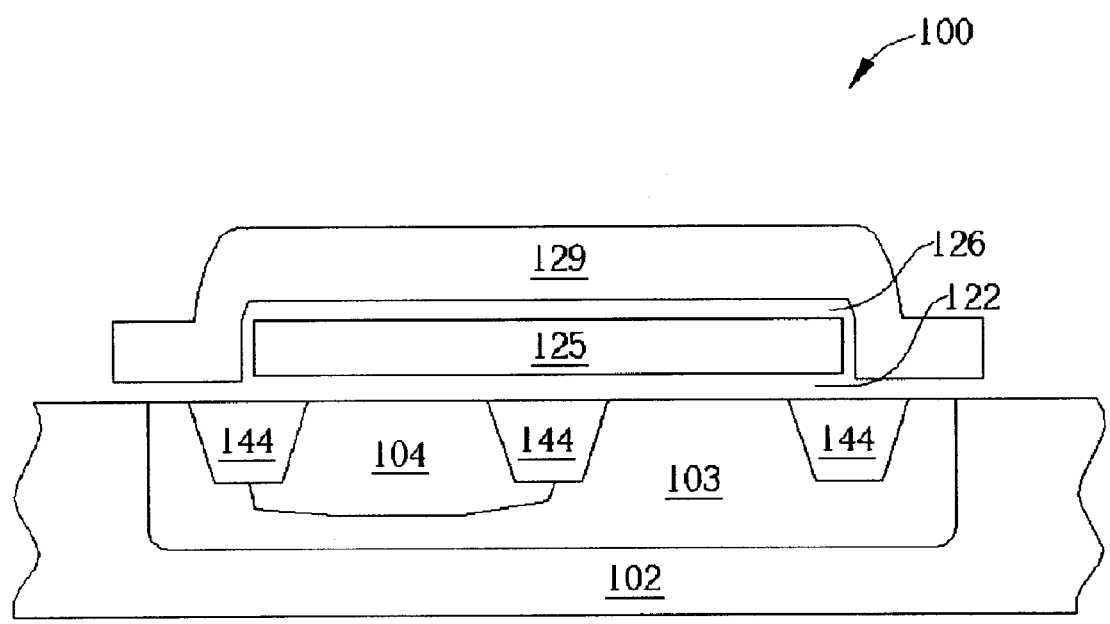
FIG. 4 is a cross-sectional schematic diagram along line 4—4" of the EEPROM device shown in FIG. 2.

Please refer to FIG. 2 to FIG. 4, FIG. 2 is a layout diagram of the present invention EEPROM device 100. FIG. 3 is a cross-sectional schematic diagram of the EEPROM device 100 shown in FIG. 2. FIG. 4 is a cross-sectional schematic diagram along line 4—4" of the EEPROM device 100 shown in FIG. 2. As shown in FIG. 2 and FIG. 3, the present invention EEPROM device 100 is disposed on a semiconductor wafer 101. The semiconductor wafer 101 comprises a P-type silicon substrate 102, a deep N-well (DNW) 103 disposed in the P-type silicon substrate 102, and a P-well (PW) 104 disposed in the deep N-well 103. The EEPROM device 100 comprises a P-type memory cell 106, an N-type select gate transistor 108, and a P-type select gate transistor 112.

The memory cell 106 comprises a source region 114 and a drain region 116 disposed on a surface of the deep N-well well 103, and a channel region 118 between the source region 114 and the drain region 116. Both the source region 114 and the drain region 116 are P-type heavy doped regions, and the source region 114 is electrically connected to a source line (SL). The memory cell 106 further comprises a tunnel oxide layer 122, a floating gate 124, a dielectric layer 126, and a control gate 128. The tunnel oxide layer 122 is disposed on a top surface 123 of the deep N-well 103, and the tunnel oxide layer 122 covers the channel region 118. The floating gate 124 is disposed on a surface of the tunnel oxide layer 122. The dielectric layer 126 covers the floating gate 124. The control gate 128 is disposed on a surface of the dielectric layer 126 and the surface of the tunnel oxide layer 122.

The N-type select gate transistor 108 comprises a source region 132, a drain region 134, and a select gate (SG)136. The source region 132 of the N-type select gate transistor 108 is electrically connected to an erase bit line (Eb1). The P-type select gate transistor 112 comprises a source region 138, a drain region, and a select gate 142. Since the drain region of the P-type select gate transistor 112 is overlapped with the drain region 116 of the memory cell 106, it is not specially marked. The source region 138 of the P-type select gate transistor 112 is electrically connected to a program bit line (Pb1). Because the select gates 136, 142 and the floating gate 124 in the memory cell 106 are formed by etching a same polysilicon layer, a polysilicon layer 143 is shown on top of each of the select gates 136, 142 in FIG. 3.

When viewing along line 4—4", the deep N-well 103 is disposed in the P-type silicon substrate 102, and the P-well 104 is disposed in the deep N-well 103. The tunnel oxide layer 122 is disposed on the P-type silicon substrate 102. A polysilicon layer 125 used as the floating gate 124 is disposed on the tunnel oxide layer 122. The dielectric layer 126 covers the polysilicon layer 125 used as the floating gate 124. Another polysilicon layer 129 used as the control gate 128 is disposed on the dielectric layer 126 and the tunnel oxide layer 122, as shown in FIG. 4. In addition, the P-well 104 and the deep N-well 103 are isolated from each other by a shallow trench isolation 144.

By cross-referring FIG. 2, FIG. 3, and FIG. 4, it is very clear to see the polysilicon layers 146 disposed in pairs and in parallel, the heavy doped region used as the source region 132 of the N-type select gate transistor 108 disposed in the P-well 104, the heavy doped region used as the source region 138 of the P-type select gate transistor 112 disposed in the deep N-well 103, and the shallow trench isolations 144 used for isolating the P-well 104 and the deep N-well 103 in FIG. 2. It is worth noting that the shallow trench isolations 144 are not shown in FIG. 3 in order to prepare the drawing more conveniently.

Figure 5:
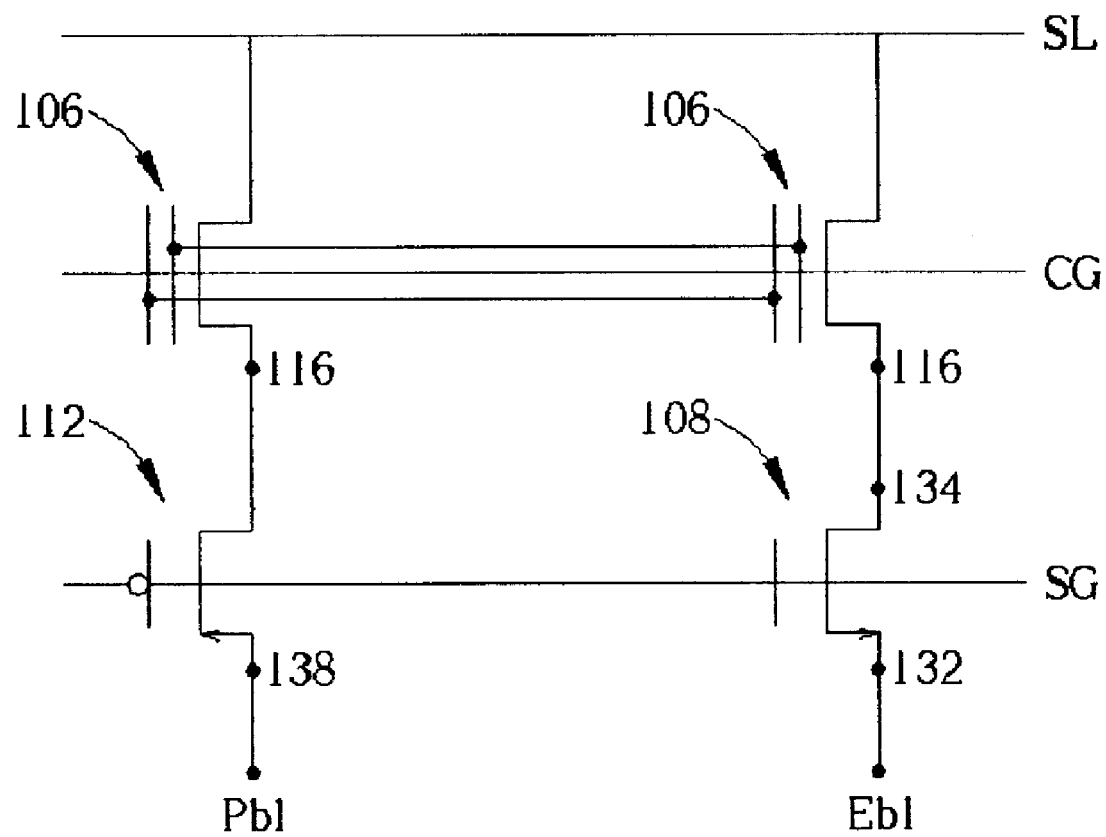
FIG. 5 is a circuit diagram of the present invention EEPROM device.

Please refer to FIG. 5, FIG. 5 is a circuit diagram of the present invention EEPROM device 100. As shown in FIG. 5, the present invention EEPROM device 100 comprises the P-type select gate transistor 112, the N-type select gate transistor 108, and the P-type memory cell 106. The source region 138 of the P-type select gate transistor 138 is electrically connected to the program bit-line, and the source region 132 of the N-type select gate transistor 108 is electrically connected to the erase bit-line. The drain region 116 of the P-type memory cell 106 is electrically connected to the drain of the P-type select gate transistor 112 (overlapping with the drain region 116 of the memory cell 106) and the drain region 134 of the N-type select gate transistor. The P-type select gate transistor 112 and the N-type select gate transistor 108 are electrically connected through the select gates 136, 142 (please refer to FIG. 3), and the P-type memory cell 106 is simultaneously electrically connected to the P-type select gate transistor 112 and the N-type select gate transistor 108 due to the special layout shown in FIG. 2.

Please refer to FIG. 6, FIG. 6 is an example table illustrating operation voltages of the present invention EEPROM device 100. As shown from FIG. 3 to FIG. 6, a first positive potential (such as +8 V) is supplied to the control gate 128 such that the positive voltage is capacitively coupled to the floating gate 124 to build an electric field that transverses the tunnel oxide layer 122, when the present invention EEPROM device 100 performs programming. Then a negative potential (such as 8 V) is supplied to the select gate 142 of the P-type select gate transistor 112 to turn on the P-type select gate transistor 112. When a negative program potential (such as 6 V) is supplied to the program bit-line, the program potential is therefore passed to the drain region 116 of the P-type memory cell 106 through the turned-on P-type select gate transistor 112. Since a high positive potential difference exists between the control gate 128 and the drain region 116, band-to-band tunneling (BTBT) phenomenon thus occurs to generate electron-hole pairs at a junction of the drain region 116 of the P-type memory cell 106. Electrons in the electron-hole pairs are accelerated by the electric field in the depletion region to acquire sufficient energy to become hot electrons. The hot electrons then inject into the floating gate 124 to complete the band-to-band tunneling induced hot-electrons (BTBTIHE) program.

When the present invention EEPROM device 100 performs erasing, a second negative potential (such as 8 V) is supplied to the control gate 128 first. Then a second positive potential (such as +10 V) is supplied to the select gate 136 of the N-type select gate transistor 108 to turn on the N-type select gate transistor 108. When a positive erase potential (such as +8 V) is supplied to the erase bit-line, the erase potential is passed to the drain region 116 of the P-type memory cell 106 through the turned on N-type select gate transistor 108. Since a high negative potential difference exists between the control gate 128 and the drain region 116, and-another high negative potential exists between the control gate 128 and the deep N-well 103 (the deep N-well 103 is grounded through a terminal), electrons stored in the floating gate 124 are affected by the electric field that transverses the tunnel oxide layer 122. The electrons thus transverse the tunnel oxide layer 122 by Fowler-Nordheim tunneling mechanism to complete the Fowler-Nordheim erase.

Furthermore, when the present invention EEPROM device 100 performs reading, a third positive potential (such as +3.3 V) is supplied to the source line electrically connected to the source region 114 of the P-type memory cell 106. Then a potential lower than the third positive potential (such as +1 V) is supplied to the program bit-line. At this time, since a potential difference exists between the source line and the program bit-line, electrons stored in the floating gate 124 will flow out to cause a current measurable at the terminal of the source line. Oppositely, if there are no electrons stored in the floating gate 124, the current higher than a specific value cannot be measured at the terminal of the source line The EEPROM device according to the present invention utilizes the P-type EEPROM cell to replace the prior art N-type EEPROM cell. Therefore, a P-type select gate transistor electrically connected to the program bit-line is utilized to perform the band-to-band tunneling induced hot-electrons program, and an N-type select gate transistor electrically connected to the erase bit-line is utilized to perform the Fowler-Nordheim tunneling erase. Since the band-to-band tunneling induced hot-electrons phenomenon can generate a considerable current, the injection of hot electrons caused by band-to-band tunneling mechanism is faster than that caused by Fowler-Nordheim tunneling mechanism. Program speed and program efficiency are thus greatly improved to eliminate the need of the tunnel window utilized in the prior art EEPROM structure. When applying the present invention structure to a practical production line, byte-addressable EEPROM products having high programming speed, low operation voltage, high reliability, and small size are fabricated once the high gate coupling ratio and the high quality of the tunnel oxide are maintained.

Compared to the prior art EEPROM device and structure and method of operation, the present invention EEPROM device utilizes the P-type EEPROM cell to replace the N-type EEPROM cell. In addition, a P-type select gate transistor electrically connected to the program bit-line is utilized to perform the band-to-band tunneling induced hot-electrons program, and an N-type select gate transistor electrically connected to the erase bit-line is utilized to perform the Fowler-Nordheim tunneling erase. Due to the considerable current generated by the band-to-band tunneling induced hot-electrons phenomenon, the injection of hot electrons caused by band-to-band tunneling mechanism is faster than that caused by Fowler-Nordheim tunneling mechanism. Program speed is therefore greatly improved. Because of the obviously lifted program efficiency, the tunnel window, adapted in the prior art EEPROM device structure, can be replaced by a common tunnel oxide layer in the present invention EEPROM device structure. As a result, the problems of complex processing and raised cost incurred from misalignment, which usually occurs in the prior art, are avoided. The barrier to device shrinkage is not encountered. In addition, operation voltage is obviously lowered to expand the range of applicability under the industry stream of lightweight and small size.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of programming and erasing an electrically erasable programmable read-only memory (EEPROM) device comprising performing a band-to-band tunneling induced hot-electrons (BTBTIHE) program via a program bit-line (Pb1) and performing a Fowler-Nordheim (FN) tunneling erase via an erase bit-line (Eb1).

2. The method of claim 1 wherein the EEPEOM device comprises:
   a P-type transistor, a source of the P-type transistor being electrically connected to the program bit-line;
   an N-type transistor, a source of the N-type transistor being electrically connected to the erase bit-line; and
   a double gate P-type transistor, a drain of the double gate P-type transistor being electrically connected to a drain of the P-type transistor and a drain of the N-type transistor.

3. The method of claim 2 wherein both the P-type transistor and the N-type transistor are select gate transistors.

4. The method of claim 2 wherein the double gate P-type transistor is an EEPROM cell.

5. The method of claim 2 wherein the band-to-band tunneling induced hot-electrons program comprises the following steps:
   supplying a first positive potential to a control gate of the double gate P-type transistor;
   supplying a first negative potential to a gate of the P-type transistor to turn on the P-type transistor; and
   supplying a second negative potential to the program bit-line to pass the second negative potential to the drain of the double gate P-type transistor.

6. The method of claim 5 wherein the hot electrons are generated at a junction of the drain of the double gate P-type transistor due to band-to-band tunneling induced electron-hole pair generation.

7. The method of claim 2 wherein the Fowler-Nordheim tunneling erase comprises the following steps:
   supplying a third negative potential to a control gate of the double gate P-type transistor;
   supplying a second positive potential to a gate of the N-type transistor to turn on the N-type transistor; and
   supplying a third positive potential to the erase bit-line to pass the third positive potential to the drain of the double gate P-type transistor.

8. The method of claim 7 wherein a potential difference between the control gate of the double gate P-type transistor and the drain of the double gate P-type transistor causes the Fowler-Nordheim tunneling erase.

9. The method of claim 2 further comprising a reading method comprising the following steps:
   supplying a fourth positive potential to a source line of the double gate P-type transistor; and
   supplying a potential lower than the fourth positive potential to the program bit-line.

10. An electrically erasable programmable read-only memory (EEPROM) device programmed by a band-to-band tunneling induced hot-electrons (BTBTIHE) program and erased by a Fowler-Nordheim (FN) tunneling erase comprising:
    a P-type transistor, a source of the P-type transistor being electrically connected to a program bit-line (Pb1);
    an N-type transistor, a source of the N-type transistor being electrically connected to an erase bit-line (Eb1); and
    a double gate P-type transistor, a drain of the double gate P-type transistor being electrically connected to a drain of the P-type transistor and a drain of the N-type transistor.

11. The EEPROM device of claim 10 wherein both the P-type transistor and the N-type transistor are select gate transistors.

12. The EEPROM device of claim 10 wherein the double gate P-type transistor is an EEPROM cell.

13. The EEPROM device of claim 12 wherein the double gate P-type transistor further comprises a source electrically connected to a source line and a channel between the source and the drain.

14. The EEPROM device of claim 13 wherein the double gate P-type transistor further comprises a tunnel oxide layer covering a top surface of the channel, a floating gate disposed on a top surface of the tunnel oxide layer, an isolation layer covering a surface of the floating gate, and a control gate disposed on a top surface of the isolation layer.

15. The EEPROM device of claim 14 wherein the band-to-band tunneling induced hot-electrons program comprises the following steps:
    supplying a first positive potential to the control gate of the double gate P-type transistor;
    supplying a first negative potential to a gate of the P-type transistor to turn on the P-type transistor; and
    supplying a negative program potential to the program bit-line to pass the negative program potential to the drain of the double gate P-type transistor.

16. The EEPROM device of claim 15 wherein the negative program potential passed to the drain of the double gate P-type transistor through the turned on P-type transistor generates the band-to-band tunneling induced hot electrons at a junction of the drain of the double gate P-type transistor.

17. The EEPROM device of claim 14 wherein the Fowler-Nordheim tunneling erase comprises the following steps:
    supplying a second negative potential to the control gate of the double gate P-type transistor;
    supplying a second positive potential to a gate of the N-type transistor to turn on the N-type transistor; and
    supplying a positive erase potential to the erase bit-line to pass the positive erase potential to the drain of the double gate P-type transistor.

18. The EEPROM of claim 17 wherein a potential difference between the control gate of the double gate P-type transistor and the drain of the double gate P-type transistor causes the Fowler-Nordheim tunneling erase.

19. The EEPROM device of claim 13 further comprising a reading method comprising the following steps:
    supplying a third positive potential to the source line of the double gate P-type transistor; and
    supplying a potential lower than the third positive potential to the program bit-line.

* * * * *